United States Patent
Chung et al.

(10) Patent No.: US 9,466,658 B2
(45) Date of Patent: Oct. 11, 2016

(54) ORGANIC LIGHT EMITTING DISPLAY DEVICES

(71) Applicant: Samsung Display Co., Ltd., Yongin, Gyeonggi-Do (KR)

(72) Inventors: Jin-Koo Chung, Suwon-si (KR); Jun-Ho Choi, Yongin-si (KR); Young-Woo Song, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 3 days.

(21) Appl. No.: 14/538,054

(22) Filed: Nov. 11, 2014

(65) Prior Publication Data

US 2015/0357383 A1 Dec. 10, 2015

(30) Foreign Application Priority Data

Jun. 5, 2014 (KR) .................. 10-2014-0068571

(51) Int. Cl.
*H01L 27/32* (2006.01)

(52) U.S. Cl.
CPC ....... *H01L 27/3297* (2013.01); *H01L 27/3218* (2013.01); *H01L 27/3276* (2013.01); *H01L 27/3288* (2013.01)

(58) Field of Classification Search
CPC .................................................. H01L 27/324
See application file for complete search history.

(56) References Cited

U.S. PATENT DOCUMENTS

| | | | | |
|---|---|---|---|---|
| 6,520,819 B1* | 2/2003 | Sakaguchi | ......... | H01L 27/3283 313/504 |
| 6,771,028 B1* | 8/2004 | Winters | ............... | G09G 3/3233 315/169.1 |
| 7,382,384 B2* | 6/2008 | Winters | ............... | G09G 3/3225 345/694 |
| 8,093,805 B2* | 1/2012 | Sakamoto | ........... | H01L 51/0021 313/483 |
| 8,558,222 B2* | 10/2013 | Hwang | ................. | H01L 27/326 257/40 |
| 8,691,016 B2* | 4/2014 | Sonoda | ................. | C23C 14/042 118/504 |
| 2002/0070909 A1* | 6/2002 | Asano | .................. | G09G 3/3233 345/76 |
| 2006/0028495 A1* | 2/2006 | Phan | .................... | G09G 3/2003 345/694 |
| 2006/0139503 A1* | 6/2006 | Larson | ............... | G02B 27/0025 349/39 |

(Continued)

FOREIGN PATENT DOCUMENTS

| | | |
|---|---|---|
| KR | 1020110008621 A | 1/2011 |
| KR | 1020110076641 A | 7/2011 |

(Continued)

*Primary Examiner* — Mohammad Islam
*Assistant Examiner* — Ankush Singal
(74) *Attorney, Agent, or Firm* — Cantor Colburn LLP

(57) ABSTRACT

An organic light emitting display device may include a substrate and a plurality of pixels. The plurality of pixels may be arranged on the substrate, and each of the pixels may include an opaque region and a transparent region. Here, the opaque region may include a first sub-pixel region in which a first sub-pixel is disposed, a second sub-pixel region in which a second sub-pixel is disposed, a third sub-pixel region in which a third sub-pixel is disposed, and a wiring region in which a plurality of wirings is arranged. A sub-pixel region among the first sub-pixel region, the second sub-pixel region, and the third sub-pixel region is overlapped with the wiring region.

18 Claims, 4 Drawing Sheets

(56) References Cited

U.S. PATENT DOCUMENTS

| | | | | |
|---|---|---|---|---|
| 2006/0170712 | A1* | 8/2006 | Miller | H01L 27/3211 345/695 |
| 2006/0279202 | A1* | 12/2006 | Sakamoto | H01L 51/5212 313/504 |
| 2007/0086090 | A1* | 4/2007 | Wang | G02B 27/225 359/464 |
| 2008/0001525 | A1* | 1/2008 | Chao | H01L 27/3211 313/500 |
| 2008/0007492 | A1* | 1/2008 | Koh | H01L 27/3213 345/76 |
| 2008/0084376 | A1* | 4/2008 | Hirota | G09G 3/3607 345/88 |
| 2008/0117154 | A1* | 5/2008 | Yeh | G09G 3/3648 345/90 |
| 2009/0121983 | A1* | 5/2009 | Sung | H01L 27/3218 345/76 |
| 2009/0141052 | A1* | 6/2009 | Hamagishi | G02B 27/2214 345/694 |
| 2009/0322215 | A1* | 12/2009 | Sung | H01L 27/3211 313/504 |
| 2011/0012816 | A1 | 1/2011 | Kang et al. | |
| 2011/0147770 | A1* | 6/2011 | Hwang | H01L 27/326 257/89 |
| 2011/0273409 | A1 | 11/2011 | Lee et al. | |
| 2011/0291095 | A1* | 12/2011 | Park | G02F 1/133512 257/59 |
| 2012/0056531 | A1* | 3/2012 | Park | H01L 27/3211 313/506 |
| 2012/0080680 | A1 | 4/2012 | Choi et al. | |
| 2012/0120035 | A1* | 5/2012 | Yang | G09G 3/3614 345/205 |
| 2013/0114134 | A1* | 5/2013 | Inoue | H04N 13/0409 359/462 |
| 2013/0300956 | A1* | 11/2013 | Chen | G02B 27/2214 349/15 |
| 2015/0187256 | A1* | 7/2015 | Bloks | G06T 11/203 345/639 |

FOREIGN PATENT DOCUMENTS

| | | |
|---|---|---|
| KR | 1020110123124 A | 11/2011 |
| KR | 1020120035039 A | 4/2012 |

* cited by examiner

ORGANIC LIGHT EMITTING DISPLAY DEVICES

This application claims priority to Korean patent Application No. 10-2014-0068571, filed on Jun. 5, 2014, and all the benefits accruing therefrom under 35 U.S.C. §119, the disclosure of which is hereby incorporated by reference herein in its entirety.

BACKGROUND

1. Field

Exemplary embodiments of the invention relate to organic light emitting display devices. More particularly, exemplary embodiments of the invention relate to organic light emitting display devices including a structure having at least one sub-pixel region overlapped with a wiring region.

2. Description of the Related Art

An organic light emitting display ("OLED") device displays information such as images, letters and/or characters using light generated by combination of holes provided from an anode and electrons provided from a cathode in an organic layer. Since the OLED device has several advantageous such as relatively large view angle, rapid response speed, small thickness, low power consumption, etc., the OLED device has become one of the prospecting next-generation display devices.

SUMMARY

Research in accordance with a transparent organic light emitting display ("OLED") device having a transparent state and a non-transparent state has been accelerated. Generally, the transparent OLED device may include an opaque region having a pixel region in which a plurality of sub-pixels are disposed and a wiring region in which a plurality of wirings are arranged, and a transparent region in which a light is transmitted.

In the conventional transparent OLED device, however, aperture ratios of sub-pixels and an area of the transparent region may not be sufficiently increased because the sub-pixels of the conventional transparent OLED device are disposed in the pixel region having restricted dimensions and/or shape.

One or more exemplary embodiment provides an OLED device including a structure having at least one sub-pixel region substantially overlapped with a wiring region to improve an aperture ratio of other sub-pixels and of an area of a transparent region.

According to an exemplary embodiment of the invention, there is provided an OLED device including a substrate and a plurality of pixels. The plurality of pixels is arranged on the substrate, and each of the pixels includes an opaque region and a transparent region. Here, the opaque region includes a first sub-pixel region in which a first sub-pixel is disposed, a second sub-pixel region in which a second sub-pixel is disposed, a third sub-pixel region in which a third sub-pixel is disposed, and a wiring region in which a plurality of wirings is arranged. A sub-pixel region among the first sub-pixel region, the second sub-pixel region, and the third sub-pixel region is overlapped with the wiring region.

In an exemplary embodiment, the first and the third sub-pixel regions may be disposed adjacent to the transparent region along a first direction, and the second sub-pixel region may be disposed adjacent to the transparent region along a second direction perpendicular to the first direction.

In an exemplary embodiment, the opaque regions of adjacent pixels may be symmetrically disposed.

In an exemplary embodiment, a planar area of the first sub-pixel region, a planar area of the second sub-pixel region and a planar area of the third sub-pixel region may be different from one another.

In an exemplary embodiment, the sub-pixel region overlapped with the wiring region among the first to the third sub-pixel regions may be entirely overlapped with the wiring region.

In an exemplary embodiment, a planar area of the sub-pixel region entirely overlapped with the wiring region among the first to the third sub-pixel regions may be smaller than planar areas of the other sub-pixel regions among the first to the third sub-pixel regions.

In an exemplary embodiment, wherein the sub-pixel region overlapped with the wiring region among the first to the third sub-pixel regions may be partially overlapped with the wiring region.

In an exemplary embodiment, the OLED display device may additionally include a first circuit region electrically connected to the first sub-pixel region, a second circuit region electrically connected to the second sub-pixel region, and a third circuit region electrically connected to the third sub-pixel region.

In an exemplary embodiment, a sub-pixel region among the third sub-pixel regions may be overlapped with a circuit region among the first to the third circuit regions.

In an exemplary embodiment, the plurality of wirings may include a gate line, a data line or a common power line.

In an exemplary embodiment, the first sub-pixel, the second sub-pixel and the third sub-pixel may emit different colors lights from among a red color light, a green color light and a blue color light.

According to an exemplary embodiment of the invention, there is provided an OLED device including a substrate and a plurality of pixels. The plurality of pixels is arranged on the substrate, and each of the pixels includes an opaque region and a transparent region. Here, the opaque region includes a first sub-pixel region in which a first sub-pixel is disposed, a second sub-pixel region in which a second sub-pixel is disposed and a wiring region in which a plurality of wirings is arranged. A sub-pixel among the first and the second sub-pixel regions is overlapped with the wiring region. First sub-pixels of adjacent pixels emit different color lights, respectively, and second sub-pixels of the adjacent pixels emit a same color light.

In an exemplary embodiment, the first sub-pixel region may be adjacent to the transparent region along a first direction, and the second sub-pixel region may be adjacent to the transparent region along a second direction perpendicular to the first direction.

In an exemplary embodiment, the opaque regions of the adjacent pixels may be symmetrically disposed.

In an exemplary embodiment, the OLED display device may additionally include a first circuit region electrically connected to the first sub-pixel region, and a second circuit region electrically connected to the second sub-pixel region.

In an exemplary embodiment, a sub-pixel among the first and the second sub-pixel regions may be overlapped with a circuit region among the first and the second circuit regions.

In an exemplary embodiment, a planar area of the first sub-pixel region may be different from a planar area of the second sub-pixel region.

In an exemplary embodiment, the sub-pixel region overlapped with the wiring region among the first and the second sub-pixel regions may be entirely overlapped with the wiring region.

In an exemplary embodiment, the sub-pixel region entirely overlapped with the wiring region among the first and the second sub-pixel regions may have a planar area smaller than a planar area of the other sub-pixel region among the first and the second sub-pixel regions.

In an exemplary embodiment, the sub-pixel region overlapped with the wiring region among the first and the second sub-pixel regions may be partially overlapped with the wiring region.

One or more exemplary embodiment of an OLED device in accordance with the invention includes a transparent region and an opaque region. The opaque region may include a pixel region including a first sub-pixel region in which a first sub-pixel is disposed, a second sub-pixel region in which a second sub-pixel is disposed, a third sub-pixel region in which a third sub-pixel is disposed, and a wiring region in which a plurality of wirings is arranged. A sub-pixel among the first sub-pixel region, the second sub-pixel region and the third sub-pixel region may not be located in the pixel region in which dimensions, shape, etc. are restricted. The sub-pixel not located in the pixel region among the first sub-pixel region, the second sub-pixel region and the third sub-pixel region may be overlapped with the wiring region. The second sub-pixel region may be adjacent to a transparent region along a first direction, and only the first and the third sub-pixel regions may be disposed adjacent to the transparent region along a second direction that is substantially perpendicular to the first direction. As a result, an aperture ratio of the first sub-pixel and an aperture ratio of the third sub-pixel may be enhanced because the first sub-pixel and the third sub-pixel may be efficiently disposed in the opaque region.

One or more exemplary embodiment of an OLED device in accordance with the invention includes a transparent region and an opaque region. The opaque region may include a pixel region including a first sub-pixel region in which a first sub-pixel is disposed, a second sub-pixel region in which a second sub-pixel is disposed and a wiring region in which a plurality of wirings is arranged. A sub-pixel among the first sub-pixel region and the second sub-pixel region may not be located in the region in which dimensions, shape, etc. are restricted (e.g., a pixel region). The sub-pixel not located in the pixel region among the first sub-pixel region and the second sub-pixel region may be overlapped with the wiring region. The second sub-pixel region may be adjacent to the transparent region along a first direction, and the first sub-pixel region may be adjacent to the transparent region along a second direction that is substantially perpendicular to the first direction. Further, a first sub-pixel and a second sub-pixel included in one of pixel region and a first sub-pixel and a second sub-pixel included in an adjacent pixel region may be interactively driven. Hence, in the OLED device according to the invention, the first sub-pixel and the second sub-pixel may be efficiently disposed in the opaque region, enhanced aperture ratios of the first and the second sub-pixels may be ensured, and an area of a circuit region smaller than an area of a circuit region included a conventional OLED device may be secured owing to only the first sub-pixel and the second sub-pixel being disposed in the opaque region. As a result, an area of a transparent region may be efficiently increased.

BRIEF DESCRIPTION OF THE DRAWINGS

Illustrative, non-limiting exemplary embodiments will be more clearly understood from the following detailed description taken in conjunction containing the accompanying drawings.

DETAILED DESCRIPTION

Figure 1:
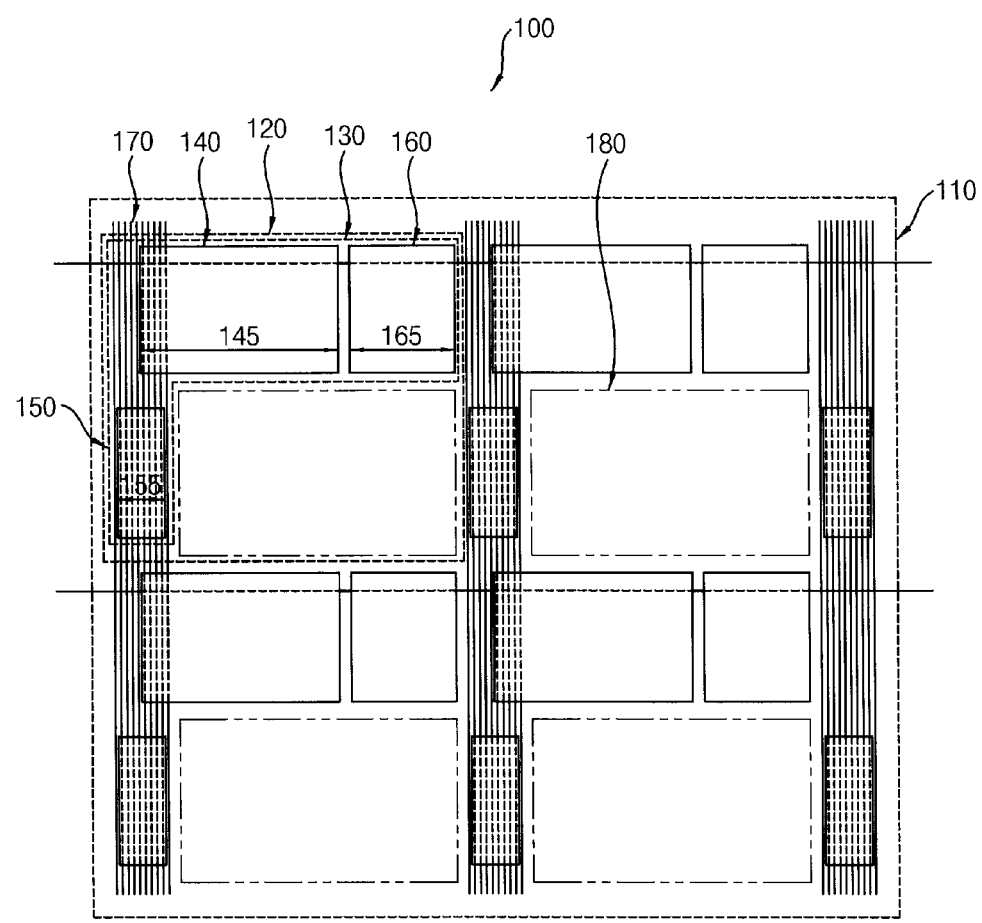
FIG. 1 is a plan view illustrating an exemplary embodiment of an organic light emitting display device in accordance with the invention.

Hereinafter, exemplary embodiments of organic light emitting display devices in accordance with the invention will be explained in detail with reference to the accompanying drawings.

An organic light emitting display device may include a substrate, a plurality of pixels, etc. The organic light emitting display device may include an opaque region from which a light is emitted, and a transparent region through which a light is transmitted. In the opaque region, for example, light may be generated within the organic light emitting display device to be emitted from the opaque region without incident or external light provided thereto (e.g., self-emissive), but the invention is not limited thereto. Where generated light is colored light, the opaque region may also be referred to as a colored light region or similar. In the transparent region, for example, light may not be generated within the organic light emitting device and incident or external light may be provided thereto and pass therethrough, with or without a color of the light being changed or altered (e.g., not self-emissive), but the invention is not limited thereto.

The opaque region of the organic light emitting display device may include a wiring region in which a plurality of wirings are arranged, and a pixel region. In the wiring region, for example, light may not be emitted and/or an image may not be displayed therefrom, but the invention is not limited thereto. In the pixel region, for example, light may be emitted and/or an image may be displayed therefrom, but the invention is not limited thereto.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath," "above" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "beneath" relative to other elements or features would then be oriented "above" relative to the other elements or features. Thus, the exemplary term "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 2:
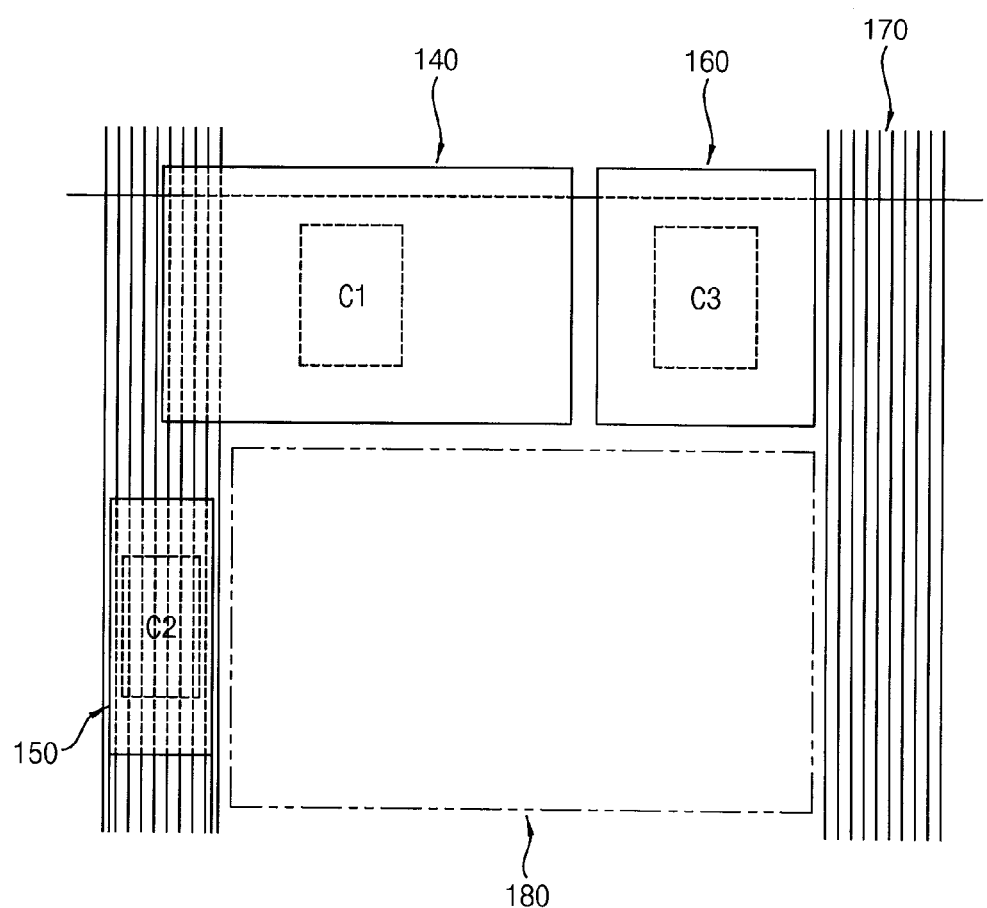
FIG. 2 is a plan view illustrating an exemplary embodiment of pixels of the organic light emitting display device of FIG. 1.

FIG. 1 is a plan view illustrating an exemplary embodiment of an organic light emitting display device in accordance with the invention. FIG. 2 is a plan view illustrating an exemplary embodiment of pixels of the organic light emitting display device of FIG. 1.

Referring to FIGS. 1 and 2, an organic light emitting display device 100 may include a substrate 110, a plurality of pixels 120, etc. The organic light emitting display device 100 illustrated in FIGS. 1 and 2 may include an opaque region 130 and a transparent region 180.

In an exemplary embodiment, for example, the opaque region 130 may include a wiring region 170 in which a plurality of wirings are arranged, and a pixel region. In an exemplary embodiment, for example, the wiring region 170 wirings may include portions of a gate line, a data line and/or a common power line, but the invention is not limited thereto. The pixel region may include a first sub-pixel region 140 in which a first sub-pixel is disposed, a second sub-pixel region 150 in which a second sub-pixel is disposed and a third sub-pixel region 160 in which a third sub-pixel is disposed.

The substrate 110 may include a transparent resin having flexibility. In an exemplary embodiment, for example, the substrate 110 may include polymethylmethacrylate-based resin, polyimide-based resin, acryl-based resin, polyacrylate-based resin, polycarbonate-based resin, polyether-based resin, sulfonic acid-based resin, polyethylene terephthalate-based resin, etc. In an exemplary embodiment, the substrate 110 may include a transparent ceramic substrate such as a glass substrate, a quartz substrate, an alumina substrate having a transmittance, etc.

The pixels 120 may be disposed and/or defined on the substrate 110. Each of the pixels 120 may include the opaque region 130 and the transparent region 180. In an exemplary embodiment, the opaque region 130 may include the first sub-pixel region 140, the second sub-pixel region 150, the third sub-pixel region 160 and the wiring region 170. Further, the opaque regions 130 of adjacent pixels may be symmetrically disposed, and an area in the plan view (e.g., a planar area) of the first sub-pixel region 140, an area of the second sub-pixel region 150 and an area of the third sub-pixel region 160 may be different from one another.

In an exemplary embodiment, an entire of one of the first to the third sub-pixel regions 140, 150 and 160 may overlap with the wiring region 170. Here, a planar area of the one of the first to the third sub-pixel regions 140, 150 and 160, of which an entirety overlaps with the wiring region 170, may be smaller than planar areas of remaining ones of the first to the third sub-pixel regions 140, 150 and 160 of which an entirety does not overlap with the wiring region 170. In an exemplary embodiment, at least one of the first to the third sub-pixel regions 140, 150 and 160 may be partially overlapped with the wiring region 170.

In an exemplary embodiment of the opaque region 130 of the pixel 120, the first sub-pixel region 140 may be disposed adjacent to one side of the transparent region 180. In an exemplary embodiment, for example, the first sub-pixel region 140 may be disposed adjacent to the transparent region 180 in a first direction. The first sub-pixel emitting a first color of light may be disposed in the first sub-pixel region 140. The first color of light emitted from the first sub-pixel region 140 may be at least one of a red color of light, a green color of light and a blue color of light. In an exemplary embodiment, the first sub-pixel region 140 may be partially overlapped with the wiring region 170. In an exemplary embodiment, for example, one side of the first sub-pixel region 140 adjacent to the second sub-pixel region 150 may be substantially overlapped with one side of the wiring region 170.

In an exemplary embodiment, an area of the first sub-pixel region 140, an area of the second sub-pixel region 150, and an area of the third sub-pixel region 160 may be different from one another. In an exemplary embodiment, for example, an area in the plan view (e.g., a planar area) of one of the sub-pixel regions, which may be entirely overlapped with the wiring region 170, may be substantially smaller than areas of the other sub-pixel regions which may not be entirely overlapped with the wiring region 170.

The first sub-pixel region 140 of the organic light emitting display device 100 illustrated in FIG. 1 may include a first width 145 (or a first length). Since the first sub-pixel region 140 is partially overlapped with the wiring region 170 in the opaque region 130, an aperture ratio of the second and the third sub-pixels may be substantially increased based on an overlapping area of the first sub-pixel region 140 and the wiring region 170. Where FIG. 1 illustrates the first sub-pixel region 140 is partially overlapped with the wiring region 170 in the opaque region 130, the invention is not limited thereto. In an alternative exemplary embodiment, the first sub-pixel region 140 is entirely overlapped with the wiring region 170 (e.g., the first sub-pixel region 140 is located on the wiring region 170). In an exemplary embodiment, the second sub-pixel region 150 may be entirely overlapped with the wiring region 170. In other exemplary embodiments, the third sub-pixel region 160 may be entirely overlapped with the wiring region 170.

A first circuit region C1, a second circuit region C2 and a third circuit region C3 may be disposed beneath the first sub-pixel region 140, the second sub-pixel region 150, and the third sub-pixel region, respectively, in a cross-sectional view of the organic light emitting display device 100, but the invention is not limited thereto. A plurality of wirings may be disposed in each of the circuit regions C1, C2 and C3. In an exemplary embodiment, for example, the circuit region wirings may include portions of a gate line, a data line and/or a common power line, but the invention is not limited thereto.

The first sub-pixel region 140 may be electrically connected to a first circuit region C1 in which a plurality of wirings is disposed. The circuit region wirings may be disposed adjacent to peripheral portions of the transparent region 180, so that the circuit region wirings may not be substantially overlapped with the transparent region 180. Where the circuit region wirings are arranged adjacent to the transparent region 180, a transmittance of the transparent region 180 may not be substantially decreased. In an exemplary embodiment, the first sub-pixel region 140 may be entirely or partially overlapped with at least one of the first circuit region C1, the second circuit region C2 and the third circuit region C3. As a result, the transmittance of the transparent region 180 may be substantially increased because at least one of the first to the third circuit regions C1, C2 and C3 may be substantially overlapped with the opaque region 130.

The second sub-pixel region 150 may be disposed adjacent to the transparent region 180 in a transverse or horizontal direction (e.g., a second direction) or a longitudinal or vertical direction (e.g., a first direction) with respect to the transparent region 180. In other words, when the second sub-pixel is disposed in the transverse direction with respect to the transparent region 180, the first and the third sub-pixels may be disposed in the longitudinal direction with respect to the transparent region 180, that is, in a different direction than the second sub-pixel. Additionally, when the second sub-pixel is disposed in the longitudinal direction with respect to the transparent region 180, the first and the third sub-pixels may be disposed in the transverse direction with respect to the transparent region 180.

The second sub-pixel emitting a second color of light may be disposed in the second sub-pixel region 150. In an exemplary embodiment, for example, the second color of light emitted from the second sub-pixel region 150 may be at least one of a red color of light, a green of color of light and a blue color of light. In an exemplary embodiment, the second sub-pixel region 150 may be entirely overlapped with the wiring region 170. In an exemplary embodiment, for example, the second sub-pixel region 150 may be disposed on the wiring region 170.

As illustrated in FIG. 1, the second sub-pixel region 150 may include a second width 155 (or a second length). In an exemplary embodiment, for example, the second width (or second length) 155 may be substantially smaller than the first width 145 (or the first length) of the first sub-pixel region 140 and a third width 165 (or a third length) of the third sub-pixel region 160, where the widths (or lengths) are taken in the same extended direction. In an exemplary embodiment, an area of the first sub-pixel region 150 and an area of the third sub-pixel region 160 may be efficiently employed because the second sub-pixel region 150 may be disposed on the wiring region 170. As a result, an aperture ratio of the first sub-pixel and an aperture ratio of the third sub-pixel may be substantially increased. Where FIG. 1 illustrates the second sub-pixel region 150 is entirely overlapped with the wiring region 170 in the opaque region 130, the invention is not limited thereto. In an alternative exemplary embodiment, the second sub-pixel region 150 is substantially overlapped with the wiring region 170. In an exemplary embodiment, the second sub-pixel region 150 may be partially overlapped with the wiring region 170. In other exemplary embodiments, the second sub-pixel region 150 may not be substantially overlapped with the wiring region 170. In an exemplary embodiment, for example, the first sub-pixel region 140 and/or the third sub-pixel region 160 may be disposed on the wiring region 170.

The second sub-pixel region 150 may be electrically connected to the second circuit region C2 in which a plurality of wirings is disposed. The circuit region wirings may not be substantially overlapped with the transparent region 180 and may be disposed adjacent to the peripheral portions of the transparent region 180. Where the circuit region wirings are arranged adjacent to the transparent region 180, a transmittance of the transparent region 180 may not be substantially degraded because the circuit region wirings are arranged adjacent to the peripheral portions of the transparent region 180. As a result, the transmittance of the transparent region 180 may be substantially increased because at least one of the second circuit region C2 may be substantially overlapped with the opaque region 130.

The third sub-pixel region 160 may be disposed adjacent to the transparent region 180 in the transverse direction (e.g., the second direction) or the longitudinal direction (e.g., the first direction) of the transparent region 180. The third sub-pixel emitting a third color of light may be disposed in the third sub-pixel region 160. In an exemplary embodiment, for example, the third color of light emitted from the third sub-pixel region 160 may be at least one of a red color of light, a green color of light and a blue color of light. In an exemplary embodiment, the third sub-pixel region 160 may not be substantially overlapped with the wiring region 170. As illustrated in FIG. 1, the third sub-pixel region 160 may include the third width 165 (or the third length). In an exemplary embodiment, for example, the third width 165 (or length) may be smaller than the first width 145 (or first length) of the first sub-pixel region 140 and may be substantially larger than the second width 155 (or second length) of the second sub-pixel region 150. Where FIG. 1 illustrates the third sub-pixel region 160 is not overlapped with the wiring region 170, the invention is not limited thereto. In an exemplary embodiment, the third sub-pixel region 160 may be entirely overlapped with the wiring region 170. In other exemplary embodiments, the third sub-pixel region 160 may be partially overlapped with the wiring region 170. As a result, an aperture ratio of the third sub-pixel may be substantially increased based on a non-overlapping area of the third sub-pixel region 160 and the wiring region 170.

The third sub-pixel region 160 may be electrically connected to the third circuit region C3 in which a plurality of wirings is disposed. The circuit region wirings may be disposed adjacent to the peripheral portions of the transparent region 180. Accordingly, the circuit region wirings may not be substantially overlapped with the transparent region 180. Where the circuit region wirings are arranged adjacent to the transparent region 180, a transmittance of the transparent region 180 may not be substantially degraded because of the circuit region wirings disposed adjacent to the peripheral portions of the transparent region 180. In an exemplary embodiment, the first sub-pixel region 180 may be substantially overlapped with the third circuit region C3. As a result, the organic light emitting display device 100 may have enhanced transmittance of the transparent region 180 because at least one of the third circuit region C3 may be substantially overlapped with the opaque region 130.

As discussed above, the wiring region wirings may be disposed in the wiring region 170. In an exemplary embodiment, the wiring region wirings may be electrically connected to the first to the third sub-pixel regions 140, 150 and 160 and the first to the third circuit regions C1, C2 and C3, respectively.

A conventional transparent organic light emitting display device may include an opaque region having a pixel region in which a plurality of sub-pixels are disposed and a wiring region in which a plurality of wirings are arranged, and a transparent region in which a light is transmitted. In the conventional transparent organic light emitting display device, an aperture ratio of the sub-pixels is hardly enhanced, and an area of the transparent region of the conventional transparent organic light emitting display device is hardly increased because the sub-pixels are disposed in a restricted region (e.g., a pixel region).

Considering the above problems of the conventional transparent organic light emitting display device, one or more exemplary embodiment of the organic light emitting display device 100 according to the invention includes a structure in which at least one of the first sub-pixel region 140, the second sub-pixel region 150 and the third sub-pixel region 160 is substantially overlapped with a wiring region 170 instead of a pixel region having restricted dimensions, shape, etc.

In an exemplary embodiment, for example, the second sub-pixel region 150 may be disposed along the first direction (e.g., a longitudinal direction) with respect to the transparent region 180 or the second direction that is substantially perpendicular to the first direction (e.g., a longitudinal direction) with respect to the transparent region 180, and the first and the third sub-pixel regions 140 and 160 may be disposed in the second direction with respect to the transparent region 180 or the first direction with respect to the transparent region 180, respectively. That is, the second sub-pixel region 150 is disposed adjacent to the transparent region 180 in a different direction in which the first and the third sub-pixel regions 140 and 160 are disposed adjacent to the transparent region 180. Therefore, the first sub-pixel and the third sub-pixel may be efficiently disposed in a same direction (e.g., the second direction in FIGS. 1 and 2) with respect to the transparent region 180. As a result, the organic light emitting display device 100 may have improved aperture ratios of the first and the third sub-pixels.

Figure 3:
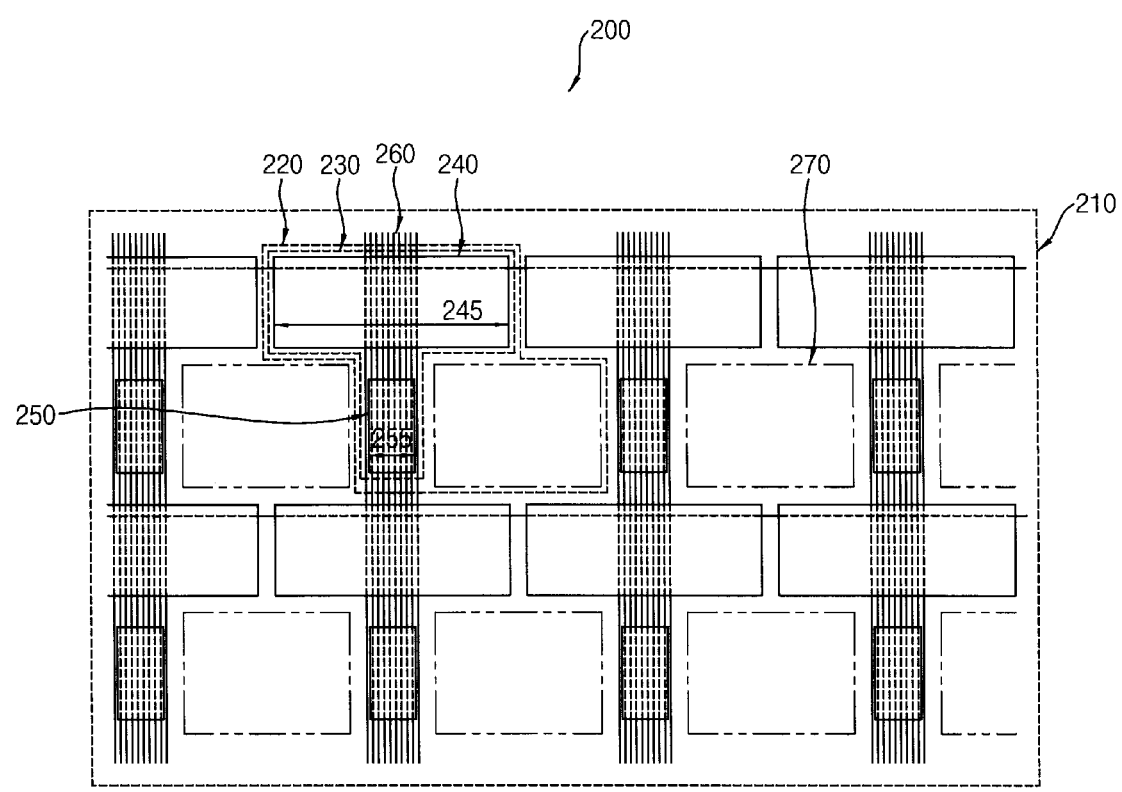
FIG. 3 is a plan view illustrating another exemplary embodiment of an organic light emitting display device in accordance with the invention.
Figure 4:
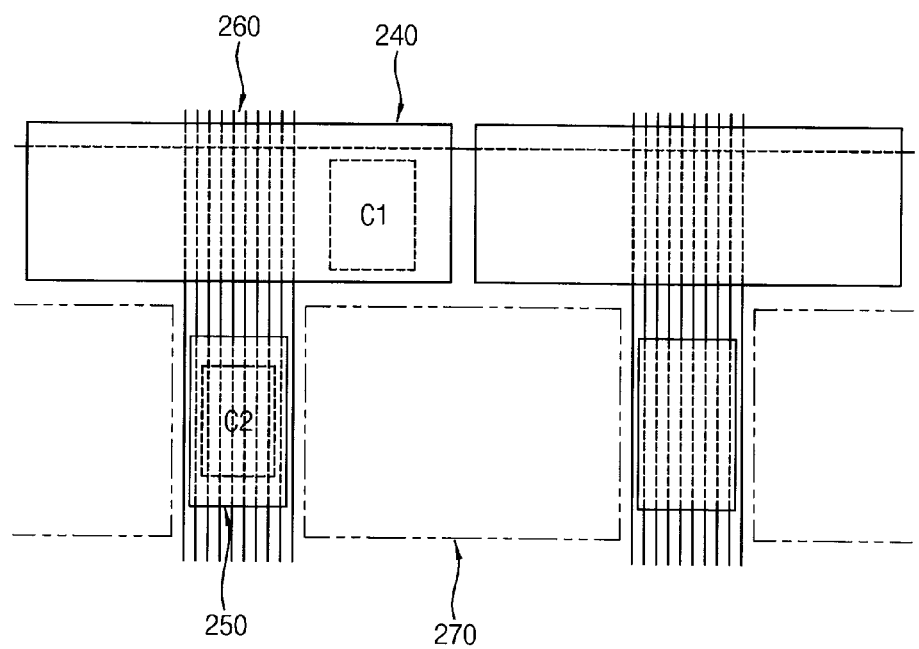
FIG. 4 is a plan view illustrating an exemplary embodiment of pixels of the organic light emitting display device of FIG. 3.

FIG. 3 is a plan view illustrating another exemplary embodiment of an organic light emitting display device in accordance with the invention. FIG. 4 is a plan view illustrating an exemplary embodiment of pixels of the organic light emitting display device of FIG. 3.

Referring to FIGS. 3 and 4, an organic light emitting display device 200 may include a substrate 210, a plurality of pixels 220, etc. The organic light emitting display device 200 illustrated in FIGS. 3 and 4 may include an opaque region 230 and a transparent region 270.

In an exemplary embodiment, for example, the opaque region 230 may include a wiring region 260 in which a plurality of wirings are arranged, and a pixel region. In an exemplary embodiment, for example, the wiring region 260 wirings may include portions of a gate line, a data line and/or a common power line, but the invention is not limited thereto. The pixel region may include a first sub-pixel region 240 in which a first sub-pixel is disposed, a second sub-pixel region 250 in which a second sub-pixel is disposed, and.

The substrate 210 may include a transparent resin having flexibility. In an exemplary embodiment, the substrate 210 may include a transparent ceramic substrate such as a glass substrate, a quartz substrate, an alumina substrate having a transmittance, etc.

The pixels 220 may be disposed and/or defined on the substrate 210. Each of the pixels 220 may include the opaque region 230 and the transparent region 270. In an exemplary embodiment, the opaque region 230 may include the first sub-pixel region 240, the second sub-pixel region 250 and the wiring region 260. In FIGS. 3 and 4, for example, the first sub-pixel region 240 may be disposed adjacent to the transparent region 270 along a first direction, and the second sub-pixel region 250 may be disposed adjacent to the transparent region 270 along a second direction perpendicular to the first direction, with respect to the transparent region 270. As illustrated in FIGS. 3 and 4, the opaque regions 230 of adjacent pixels 220 may be symmetrically disposed. An area in the plan view (e.g., a planar area) of the first sub-pixel region 240 may be different from an area of the second sub-pixel region 250.

In an exemplary embodiment, an entire of one of the first and the second sub-pixel regions 240 and 250 may overlap the wiring region 260. The one of the first and the second sub-pixel region 240 and 250 of which an entirety overlaps the wiring region 260 may have a planar area smaller than a planar area of the other one of the first and the second sub-pixel regions 240 and 250. Alternatively, one of the first and the second sub-pixel regions 240 and 250 may be partially overlapped with the wiring region 260 instead of entirely overlapped with the wiring region 260.

In an exemplary embodiment of the opaque region 230 of the pixel 220, the first sub-pixel region 440 may be disposed adjacent to one side of the transparent region 270. The first sub-pixel region 240 may be disposed adjacent to the transparent region 270 along the first direction (e.g., a longitudinal direction) with respect to the transparent region 270 or the second direction that is substantially perpendicular to the first direction (e.g., a transverse direction) with respect to the transparent region 270. The first sub-pixel may emit a first color of light and may be disposed in the first sub-pixel region 240. The first sub-pixel region 240 may be partially overlapped with the wiring region 260.

In an exemplary embodiment, the first color of light emitted from the first sub-pixel region 240 of a pixel 220 may be different from a first color of light emitted from a first sub-pixel of an adjacent pixel. In an exemplary embodiment, for example, when the first color of light emitted from the first sub-pixel region 240 is a red color of light, the first color of light emitted from one or more of the first sub-pixels of respective adjacent pixels is a blue color of light. Alternatively, when the first color of light emitted from the first sub-pixel region 240 is a blue color of light, the first color of light emitted from one or more of the first sub-pixels of respective adjacent pixels is a red color of light.

The first sub-pixel region 240 may include a first width (or length) 245. Since the first sub-pixel region 240 is partially overlapped with the wiring region 260 in the opaque region 230, an aperture ratio of the first sub-pixel may be substantially increased in accordance with an overlapped area of the first sub-pixel region 240 and the wiring region 260. Where FIG. 3 illustrates the first sub-pixel region 240 is partially overlapped with the wiring region 260 in the opaque region 230, the invention is not limited thereto. In an alternative exemplary embodiment, the first sub-pixel region 240 may be entirely overlapped with the wiring region 260. In another exemplary embodiment, the first sub-pixel region 240 may not be overlapped with the wiring region 260.

A first circuit region C1 and a second circuit region C2 may be disposed beneath the first sub-pixel region 240 and the second sub-pixel region 250, respectively, in a cross-sectional view of the organic light emitting display device 100, but the invention is not limited thereto.

The first sub-pixel region 240 may be electrically connected to a first circuit region C1 in which a plurality of wirings is disposed. The circuit region wirings may not be substantially overlapped with the transparent region 270 and may be disposed adjacent to peripheral portions of the transparent region 270. Where the circuit region wirings are arranged adjacent to the transparent region 270, a transmittance of the transparent region 270 may not be substantially decreased. In an exemplary embodiment, the first sub-pixel region 240 may be entirely or partially overlapped with at least one of the first circuit region C1 and the second circuit region C2. As a result, the transmittance of the transparent region 270 may be substantially increased because at least one of the first and the second circuit regions C1 and C2 may be substantially overlapped with the opaque region 230.

The second sub-pixel region 250 may be disposed adjacent to the transparent region 270 along the first direction (e.g., a longitudinal direction) with respect to the transparent region 270 or the second direction that is substantially perpendicular to the first direction (e.g., a transverse direction) with respect to the transparent region 270.

A second sub-pixel emitting a second color of light may be disposed in the second sub-pixel region 250. As illustrated in FIG. 3, the second sub-pixel region 250 may be entirely overlapped with the wiring region 260. In an exemplary embodiment, for example, the second sub-pixel region 250 may be disposed on the wiring region 260 (e.g., above in a cross-sectional view). In an exemplary embodiment, the second color of light emitted from the second sub-pixel region 250 of the pixel 220 may be the same as a second color of light emitted from a second sub-pixel of one or more adjacent pixels. In an exemplary embodiment, for example, the second color of light may be a green color of light.

The second sub-pixel region 250 may include a second width (or length) 255. An area of the first sub-pixel region 250 may be efficiently employed because the second sub-pixel region 250 may be disposed on the wiring region 260. In an exemplary embodiment, for example, the second width (or length) 255 may be substantially larger than the first width (or length) 245. Since the second sub-pixel region 250 is disposed on the wiring region 260, an aperture ratio of the first sub-pixel may be improved. Where FIG. 3 illustrates the second sub-pixel region 250 is entirely overlapped with the wiring region 260 in the opaque region 230, the invention is not limited thereto. In an alternative exemplary embodiment, the second sub-pixel region 250 may be partially overlapped with the wiring region 260. In another exemplary embodiment, the second sub-pixel region 250 may not be overlapped with the wiring region 260.

The second sub-pixel region 250 may be electrically connected to the second circuit region C2 in which a plurality of wirings is disposed. The circuit region wirings may not be substantially overlapped with the transparent region 270 and may be disposed adjacent to the peripheral portions of the transparent region 270. Where the circuit region wirings are arranged adjacent to the peripheral portions of the transparent region 270, a transmittance of the transparent region 270 may not be substantially decreased. As a result, the transmittance of the transparent region 270 may be substantially increased because at least one of the second circuit region C2 may be substantially overlapped with the opaque region 230.

The organic light emitting display device 200 may include the first sub-pixel region 240, the second sub-pixel region 250, and the wiring region 260 in the opaque region 230 of the pixels 220. Further, the first sub-pixel and the second sub-pixel included in a single one pixel region and the first and the second sub-pixels included in a single one adjacent pixel region may be interactively driven. Thus, the first sub-pixel and the second sub-pixel may be efficiently disposed in the opaque region 230 of the adjacent pixels, and the organic light emitting display device 200 may have enhanced aperture ratios of the first and the second sub-pixels, and smaller areas of circuit regions, as compared to those of a conventional organic light emitting display device because only the first sub-pixel and the second sub-pixel may be disposed in the opaque region 230. As a result, an area of a transparent region 270 may be efficiently increased based on the decreased area of the circuit regions.

As discussed above, the wiring region wirings may be disposed in the wiring region 260. In an exemplary embodiment, the wiring region wirings may be electrically connected to the first and the third sub-pixel regions 240 and 250 and the first and the second circuit regions C1 and C2.

A conventional transparent organic light emitting display device may include an opaque region having a pixel region in which a plurality of sub-pixels are disposed and a wiring region in which a plurality of wirings are arranged, and a transparent region in which a light is transmitted. In the conventional transparent organic light emitting display device, aperture ratios of the sub-pixels are hardly enhanced, and an area of a transparent region of the conventional transparent organic light emitting display device is hardly increased because the sub-pixel is disposed in a restricted region (e.g., a pixel region).

Considering the above problems of the conventional transparent organic light emitting display device, one or more exemplary embodiment of the organic light emitting display device 200 according to the invention includes a structure in which at least one of the first sub-pixel region 240 and the second sub-pixel region 250 is disposed on a wiring region 260 instead of being disposed a pixel region having restricted dimensions, shape, etc.

In an exemplary embodiment, for example, the second sub-pixel region 250 may be disposed in a transverse direction with respect to the transparent region 270 or in longitudinal direction with respect to the transparent region 270, and the second sub-pixel region 250 may be disposed in a longitudinal direction with respect to the transparent region 270 or a transverse direction with respect to the transparent region 270. That is, the second sub-pixel region 250 is disposed adjacent to the transparent region 270 in a different direction in which the first sub-pixel region 240 is disposed adjacent to the transparent region 270. Accordingly, the first sub-pixel may be efficiently disposed in the longitudinal direction with respect to the transparent region 270 or the transverse direction with respect to the transparent region 270. As a result, the aperture ratio of the first sub-pixel may be enhanced.

In addition, the opaque region 230 may include the first sub-pixel region 240, the second sub-pixel region 250 and the wiring region 260. Thus, the area of the circuit region may be efficiently decreased. As a result, the area of the transparent region 270 may be efficiently increased based on the decreased area of the circuit regions. Furthermore, in one or more exemplary embodiment, the area of the transparent region 270 may be substantially larger than the area of the opaque region 230, but the invention is not limited thereto.

One or more exemplary embodiment of the invention may be employed in any electronic device including an organic light emitting display device. One or more exemplary embodiment of the invention may be used in a notebook computer, a laptop computer, a digital camera, a video camcorder, a cellular phone, a smart phone, a smart pad, a portable multimedia player ("PMP"), a personal digital assistant ("PDA"), a MP3 player, a navigation system, a television, a computer monitor, a game console, a video phone, etc.

The foregoing is illustrative of exemplary embodiments of the invention and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
   a substrate; and
   a plurality of pixels on the substrate, each of the pixels comprising:
      an opaque region and a transparent region,
   wherein the opaque region comprises:
      a first sub-pixel region in which a first sub-pixel is disposed;
      a second sub-pixel region in which a second sub-pixel is disposed;
      a third sub-pixel region in which a third sub-pixel is disposed; and
      a wiring region in which a plurality of wirings is arranged,
      wherein a sub-pixel region among the first sub-pixel region, the second sub-pixel region and the third sub-pixel region is entirely overlapped with the wiring region along a first direction.

2. The organic light emitting display device of claim 1, wherein
   the first and the third sub-pixel regions are adjacent to the transparent region along a second direction perpendicular to the first direction, and
   the second sub-pixel region is adjacent to the transparent region along the first direction.

3. The organic light emitting display device of claim 1, wherein the opaque regions of adjacent pixels are symmetrically disposed.

4. The organic light emitting display device of claim 1, wherein a planar area of the first sub-pixel region, a planar area of the second sub-pixel region and a planar area of the third sub-pixel region are different from one another.

5. The organic light emitting display device of claim 1, wherein a planar area of the sub-pixel region entirely overlapped with the wiring region along the first direction among the first to the third sub-pixel regions is smaller than planar areas of the other sub-pixel regions among the first to the third sub-pixel regions.

6. The organic light emitting display device of claim 1, wherein a sub-pixel region different from the sub-pixel region entirely overlapped with the wiring region along the first direction among the first to the third sub-pixel regions is partially overlapped with the wiring region along the first direction.

7. The organic light emitting display device of claim 1, further comprising:
   a first circuit region electrically connected to the first sub-pixel region;
   a second circuit region electrically connected to the second sub-pixel region; and
   a third circuit region electrically connected to the third sub-pixel region.

8. The organic light emitting display device of claim 7, wherein a sub-pixel region among the first to the third sub-pixel regions is overlapped with a circuit region among the first to the third circuit regions.

9. The organic light emitting display device of claim 1, wherein the plurality of wirings comprises a gate line, a data line or a common power line.

10. The organic light emitting display device of claim 1, wherein the first sub-pixel, the second sub-pixel and the third sub-pixel emit different color light from each other from among a red color light, a green color light and a blue color light.

11. An organic light emitting display device comprising:
    a substrate; and
    a plurality of pixels on the substrate, each of the pixels comprising:
       an opaque region and a transparent region,
    wherein the opaque region comprises:
       a first sub-pixel region in which a first sub-pixel is disposed;
       a second sub-pixel region in which a second sub-pixel is disposed; and
       a wiring region in which a plurality of wirings is arranged,
       wherein a sub-pixel region among the first and the second sub-pixel regions is entirely overlapped with the wiring region along a first direction,
    wherein
       first sub-pixels of adjacent pixels emit different color lights, respectively, and
       second sub-pixels of the adjacent pixels emit a same color light.

12. The organic light emitting display device of claim 11, wherein
    the first sub-pixel region is adjacent to the transparent region along a second direction perpendicular to the first direction, and the second sub-pixel region is adjacent to the transparent region along the first direction.

13. The organic light emitting display device of claim 11, wherein the opaque regions of the adjacent pixels are symmetrically disposed.

14. The organic light emitting display device of claim 11, further comprising:
   a first circuit region electrically connected to the first sub-pixel region; and
   a second circuit region electrically connected to the second sub-pixel region.

15. The organic light emitting display device of claim 14, wherein a sub-pixel region among the first and the second sub-pixel regions is overlapped with a circuit region among the first and the second circuit regions.

16. The organic light emitting display device of claim 11, wherein a planar area of the first sub-pixel region is different from a planar area of the second sub-pixel region.

17. The organic light emitting display device of claim 11, wherein the sub-pixel region entirely overlapped with the wiring region along the first direction among the first and the second sub-pixel regions has a planar area smaller than a planar area of the other sub-pixel region of the first and the second sub-pixel regions.

18. The organic light emitting display device of claim 11, wherein a sub-pixel region different from the sub-pixel region entirely overlapped with the wiring region along the first direction, among the first and the second sub-pixel regions, is partially overlapped with the wiring region along the first direction.

* * * * *